(12) United States Patent
Murthy et al.

(10) Patent No.: US 6,723,622 B2
(45) Date of Patent: Apr. 20, 2004

(54) METHOD OF FORMING A GERMANIUM FILM ON A SEMICONDUCTOR SUBSTRATE THAT INCLUDES THE FORMATION OF A GRADED SILICON-GERMANIUM BUFFER LAYER PRIOR TO THE FORMATION OF A GERMANIUM LAYER

(75) Inventors: Anand Murthy, Portland, OR (US); Ravindra Soman, Hillsboro, OR (US); Boyan Boyanov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 133 days.

(21) Appl. No.: 10/081,099

(22) Filed: Feb. 21, 2002

(65) Prior Publication Data

US 2003/0157787 A1 Aug. 21, 2003

(51) Int. Cl.$^7$ ............................................. H01L 21/365
(52) U.S. Cl. ........................ 438/507; 438/508; 438/763
(58) Field of Search ................................. 438/478, 507, 438/508, 763, 933

(56) References Cited

U.S. PATENT DOCUMENTS

| | | | |
|---|---|---|---|
| 4,857,270 A | * | 8/1989 | Maruya et al. ............. 420/578 |
| 5,221,413 A | | 6/1993 | Brasen et al. |
| 5,285,086 A | | 2/1994 | Fitzgerald, Jr. |
| 5,453,389 A | | 9/1995 | Strain et al. |
| 5,472,914 A | | 12/1995 | Martin et al. |
| 5,659,187 A | | 8/1997 | Legoues et al. |
| 5,810,924 A | | 9/1998 | Legoues et al. |
| 5,847,419 A | | 12/1998 | Imai et al. |
| 5,997,638 A | | 12/1999 | Copel et al. |
| 6,039,803 A | | 3/2000 | Fitzgerald, Jr. et al. |
| 6,117,750 A | | 9/2000 | Bensahel et al. |
| 6,303,963 B1 | | 10/2001 | Ohtani et al. |
| 2002/0022347 A1 | * | 2/2002 | Park et al. .................. 438/478 |

OTHER PUBLICATIONS

Carlin, J.A., et al., "Impact of GaAs Buffer Thickness On Electronic Quality of GaAs Grown on Graded GE/GeSi/Si Substrates," Applied Physics Letters, vol. 76, No. 14, Apr. 2000, pp. 1884–1886.

Colace, L., et al., "Ge–on–Si Approaches to the Detection of Near–Infrared Light," IEEE Journal of Quantum Electronics, vol. 35, No. 12, Dec. 1999, pp. 1843–1852.

Curie, M.T., et al., "Controlling Threading Dislocation Densities in Ge on Si Using Graded SiGe Layers and Chemical–Mechanical Polishing", Applied Physics Letters, vol. 72, No. 14, Apr. 1998, pp. 1718–1720.

Fitzgerald, E. A., et al., "Relaxed $Ge_xSi_{1-x}$ Structures for III–V Integration With Si and High Mobility Two–Dimensional Electron Gases in Si," Journal of Vacuum Science and Technology, vol. 10, No. 4, Jul./Aug. 1992, pp. 1807–1819.

Lee, M., et al., "Strained Ge Channel P–Type Metal–Oxide–Semiconductor Field–Effect Transistors Grown on $Si_{1-x}Ge_x$/Si Virtual Substrates," Applied Physics Letters, vol. 79, No. 20, Nov. 12, 2001, pp. 3344–3346.

Luryi, S., et al., "New Infrared Detector on a Silicon Chip," IEEE Transactions on Electron Devices, vol. Ed.–31, No. 9, Sep. 1984, pp. 1135–1139.

(List continued on next page.)

*Primary Examiner*—Carl Whitehead, Jr.
*Assistant Examiner*—Stephen W. Smoot
(74) *Attorney, Agent, or Firm*—Blakely, Sokoloff, Taylor & Zafman LLP

(57) ABSTRACT

A composite of germanium film for a semiconductor device and methods of making the same. The method comprises growing a graded germanium film on a semiconductor substrate in a deposition chamber while simultaneously decreasing a deposition temperature and decreasing a silicon source gas and increasing a germanium source gas over a predetermined amount of time. The graded germanium film comprises an ultra-thin silicon-germanium buffer layer and a germanium film.

18 Claims, 9 Drawing Sheets

OTHER PUBLICATIONS

Polman, A., et al., "Materials and Devices for Silicon–Based Optoelectronics," Materials Research Society, Symposium Proceedings vol. 486, Boston Massachusetts, Dec. 1–3, 1997 pp. 193–198.

Samavedam, S. B., et al., "High–Quality Germanium Photodiodes Integrated On Silicon Substrates Using Optimized Relaxed Graded Buffers," Applied Physics Letters, vol. 73, No. 15, Oct. 1998, pp. 2125–2127.

Soref, R., et al., "Silicon Based Optoelectronics," Proceedings of the IEEE, vol. 81, No. 12, Dec. 1993, pp. 1687–1706.

Wesler, J., et al., "Electron Mobility Enhancement in Strained–Si N–type Metal–Oxide–Semiconductor Field–Effect Transistors," IEEE Electron Devices Letters, Vo. 15, No. 3, Mar. 1994, pp. 100–102.

* cited by examiner

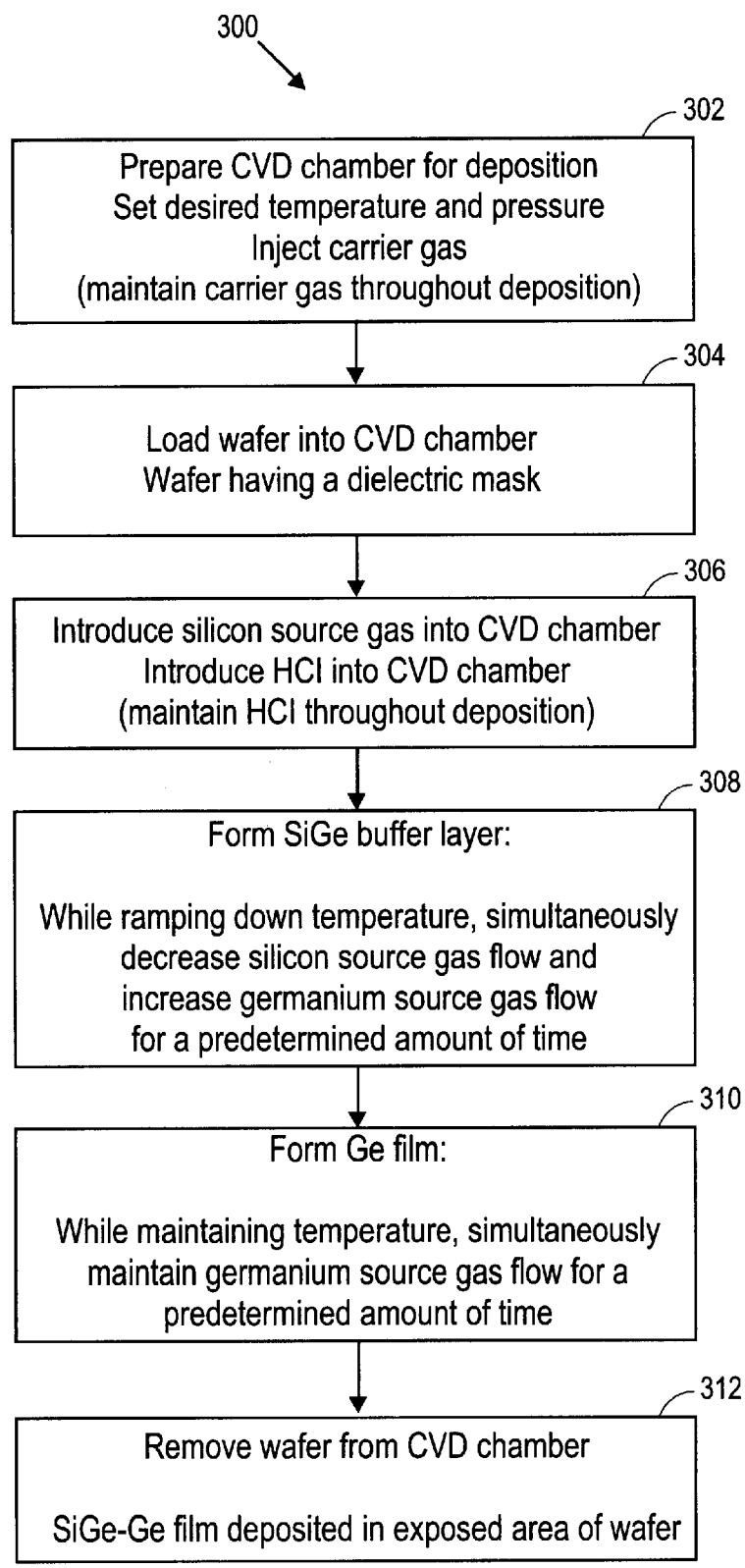

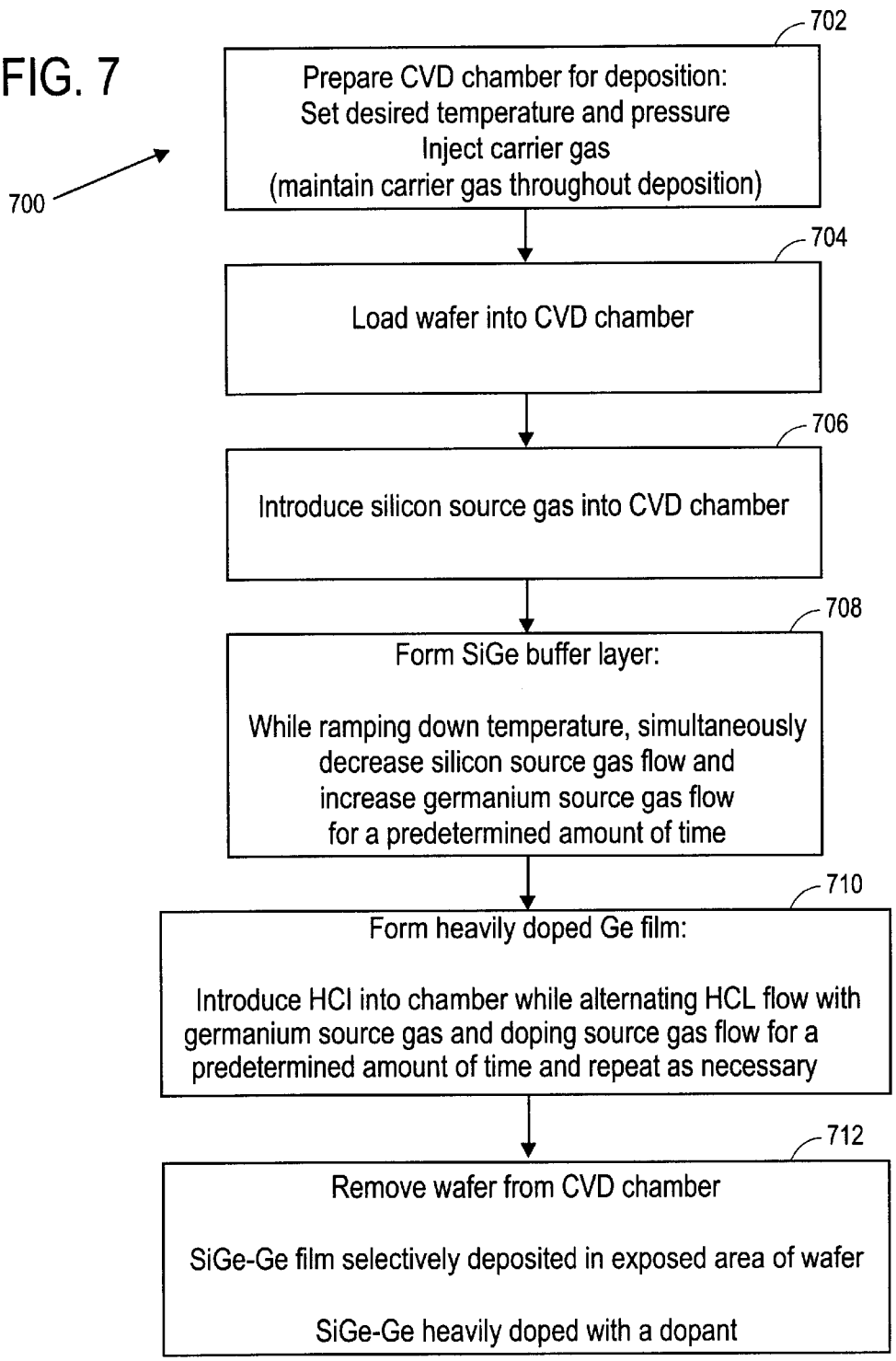

METHOD OF FORMING A GERMANIUM FILM ON A SEMICONDUCTOR SUBSTRATE THAT INCLUDES THE FORMATION OF A GRADED SILICON-GERMANIUM BUFFER LAYER PRIOR TO THE FORMATION OF A GERMANIUM LAYER

BACKGROUND OF THE INVENTION

1. Field of the Invention

The present invention relates to a semiconductor device having a low dislocation defect germanium layer and in particular, to semiconductor devices comprising a low dislocation defect germanium layer grown on an ultra-thin silicon-germanium buffer layer. The present invention further concerns the methods for making and using such devices.

2. Discussion of Related Art

Forming high quality germanium layers on a substrate is desirable. Germanium (Ge) layers grown on a silicon (Si) substrate can be used to make high mobility devices. There is thus increasing interest in using SiGe alloy as a material for microelectronic and optoelectronic device applications. Ge is known to have high carrier mobility (e.g., high hole and electron mobility) and optical absorption as compared to Si. This is one reason why Ge is useful for devices that require enhanced performance and/or high quantum efficiency. Examples of devices that would benefit from the use of a Ge film include metal-oxide-semiconductor (MOS) transistors, optical detectors, and other optoelectronic devices, to name a few.

There is a large lattice-mismatched of about 4% between the Ge and the Si. The mismatched lattice hinders the growth of coherently strained Ge beyond a critical thickness, at which point there is formation of misfit dislocations. These mistfit dislocations subsequently form threading segments, threading dislocations that penetrate the entire epitaxial layer and terminate at the free surface. Threading dislocations are undesirable defects since they cause highly faulted epitaxial Ge layers which reduces the carrier mobility, adversely affects the electronic quality and performance reliability of various electronic devices. Threading dislocations also increase the dark current in an optical detector, which induces noises in the signal. And, threading dislocations increase current leakage between the source and drain regions of a MOS transistor.

With lattice mismatch making growing Ge directly on Si a problem, SiGe buffer layers have been used to minimize the effect of this problem. The SiGe buffer layers are often graded, from 0% Ge to 100% Ge, at a low rate of change, typically 10–20% Ge/$\mu$m. To deposit the Ge layer, SiGe is first deposited as a buffer layer on a substrate (e.g., Si wafer), and Ge is finally deposited on the SiGe. This very low-slope grading scheme enables the gradual increase of the lattice constant of the semiconductor, which minimizes the generation of misfit and threading dislocation. However, the gradual change from 0% Ge to 100% Ge is often slow, and as such, necessitates the use of very thick buffer layers, typically 1–5 $\mu$m.

The presence of thick buffer layers poses several problems. Typical deposition times for the buffer layer can be in excess of four hours, which imposes a severe penalty on factory throughput in high volume applications and increases wafer fabrication costs, particularly when single-wafer epitaxial reactors are used. High performance Si CMOS fabrication techniques are moving away from the use of bulk Si. The most promising device structures which will allow the extension of Si CMOS technology below 30 nm are believed to be depleted substrate (DST) and double-gate (DG) devices. Both DST and DG applications require active layers thinner than 500 A (0.005 $\mu$m). The presence of thick buffer layers required by current state-of-the-art Ge deposition techniques makes Ge incompatible with these high-performance structures. There is also significant interest in using Ge detectors for optical clock applications in conventional CMOS technology. The use of thick buffer layers will result in severe planarity issues between the portion of the chip containing the Ge detector and the parts of the die containing Si-only devices. Films deposited in this manner develop significant surface undulations, which tend to trap dislocations. The trapping of dislocations causes new dislocations to be generated in order to relieve the stress developed due to lattice mismatch, which increases the overall dislocation density in the deposited layer. An intermediate chemical mechanical polishing (CMP) step may be necessary to restore planarity of the surface and relieve dislocation pileup.

BRIEF DESCRIPTION OF THE DRAWINGS

The present invention is illustrated by way of example and not limitation in the figures of the accompanying drawings, in which like references indicate similar elements and in which:

FIG. 3 illustrates an exemplary method of selectively forming a graded germanium film which comprises an ultra-thin graded SiGe buffer;

FIG. 7 illustrates an exemplary method of selectively forming a graded germanium film which comprises an ultra-thin graded SiGe buffer wherein the graded germanium film is heavily doped with a dopant;

DETAILED DESCRIPTION OF THE PRESENT INVENTION

In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention. The following description and drawings are illustrative of the invention and are not to be construed as limiting the invention.

Germanium (Ge) layers having good surface morphology, low defect density, and thin buffer layers are the key issues in affecting the integration of silicon substrates having Ge layers for silicon integrated circuits in electronic and optoelectronic applications, for example, in making transistors and detectors.

The present invention directs to electronic devices having an epitaxial Ge film grown on an ultra-thin graded SiGe buffer layer. The epitaxial Ge film has a heavy in situ doping of above $10^{20}$ per $cm^3$, a low defect density and a high planarity. In one example, the SiGe buffer layer has a thickness of about 17 nm to 19 nm wherein the SiGe layer is formed directly on a substrate. The Ge film is formed on the ultra-thin SiGe buffer layer. The Ge film can have a threading dislocation density of less than $10^9/cm^2$. Additionally, the present invention directs to the methods of making the epitaxial Ge film above.

Figure 1:
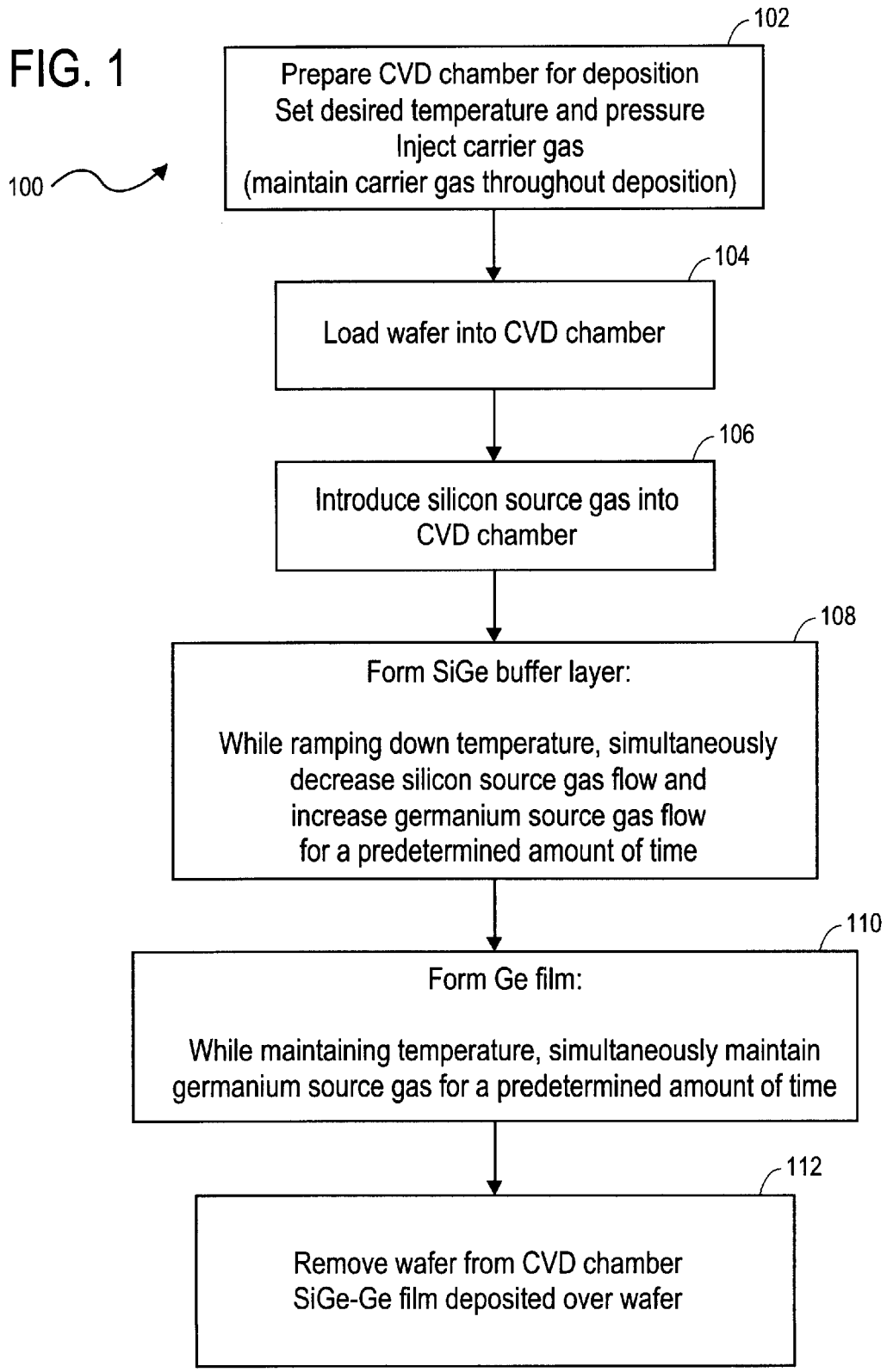
FIG. 1 illustrates an exemplary method of forming a graded germanium film which comprises a graded SiGe buffer layer and a substantially pure Ge top surface wherein the graded SiGe buffer layer is ultra-thin.

FIG. 1 illustrates an exemplary method 100 of forming a germanium silicon alloy $Ge_xSi_y$ having an upper surface comprised of substantially pure germanium. The germanium silicon alloy $Ge_xSi_y$ having an upper surface comprised of substantially pure germanium grown on a graded SiGe buffer layer is referred to as "a graded SiGe—Ge film" for short. The graded SiGe—Ge film has a gradient of increasing germanium concentration as the SiGe—Ge film extends from a substrate. At the top or near the top surface, the film comprised of only germanium and no SiGe alloy. The graded SiGe—Ge film can be formed in a conventional chemical vapor deposition (CVD) reactor. A silicon source gas, such as silane ($SiH_4$) and a germanium source gas such as germane ($GeH_4$) are used to form the graded SiGe—Ge film. The flow of the silicon source gas and the germanium source gas together with the deposition temperature are controlled to obtain the film gradient. In the method 100, simultaneously, the deposition temperature is linearly and gradually ramped down while the silicon source gas (e.g., $SiH_4$) is linearly and gradually ramped down and the germanium source gas (e.g., $GeH_4$) is linearly and gradually ramped up for a predetermined amount of time.

Continuing with FIG. 1, at box 102, a deposition chamber (e.g., CVD chamber) is prepared. The desired temperature and pressure for the deposition process is obtained. In one example, the temperature of the chamber is set to be about 625° C. to 700° C. and the pressure is set to be at atmospheric pressure (e.g., 1 atm). A carrier gas is injected into the CVD chamber. The carrier gas flow into the CVD chamber is maintained throughout the deposition process. The carrier is typically an inert gas (e.g., $H_2$, $N_2$, Ar, or He) but can be other suitable carrier gas depending on application. In one example, the carrier gas flow is introduced into the CVD chamber at a flow rate of about 20 L/minute.

At box 104 of FIG. 1, a substrate (e.g., silicon wafer) is loaded into the CVD chamber. The substrate can include a monocrystalline semiconductor wafer, a semiconductor-on-insulator wafer, or any other substrate used to form semiconductor devices. At box 106, the silicon source gas (e.g., $SiH_4$) is introduced into the CVD chamber. In one example, the silicon source gas is introduced at a rate of about 200 sccm.

Continuing with FIG. 1, at box 108, the graded SiGe buffer layer is formed on the substrate. While ramping down the temperature, simultaneously decrease the silicon source gas flow and increase the germanium source gas flow for a predetermined amount of time. More specifically, the temperature is decreased from a first (initial) temperature to a second temperature which is lower than the first temperature. The silicon source gas is decreased from a first flow rate to a second flow rate wherein the second flow rate for the silicon source gas is lower than the first flow rate. And, the germanium source gas is increased from a third flow rate (which is essentially 0 sccm) to a fourth flow rate. In one example, the predetermined amount of time ranges from 1.5 to 3.5 minutes and preferably, is about 2 minutes. The amount of time depends on the desirable thickness of the SiGe. In another example, for a predetermined amount of time, the temperature is linearly and gradually ramped down, from 625° C. down to 500° C. In yet another example, the silicon source gas is linearly and gradually ramped down, from 200 sccm down to 0 sccm; and, the germanium source gas is linearly and gradually ramped up, from 0 sccm up to 500 sccm. In another example, the silicon source gas is decreased at a rate of 1 sccm to 2 sccm per second, the temperature is decreased at a rate of 1° C. to 1.5° C. per second, and the germanium source gas is increased at a rate of 3.8 sccm to 4.5 sccm per second. In yet another example, the temperature is decreased while simultaneously decreasing the silicon source gas and increasing the germanium source gas at a rate that ensures that the threading dislocation will be confined to the area near the substrate. In this example, the lower temperature and the faster decreasing rate for the temperature is preferred.

Continuing with FIG. 1, at box 110, the Ge film is formed on the graded SiGe buffer layer. To form the Ge film, the temperature is maintained at a predetermined level while the germanium source gas flow is also maintained constant at a predetermined flow rate for a duration necessary to achieve the desired thickness for the Ge film. In one example, the temperature is maintained at 500° C. for the duration of the time necessary to form the Ge film. In another example, the germanium source gas flow is maintained at 500 sccm for that duration. In yet another example, the temperature and the germanium source gas flow is maintained constant for a duration of 5-minute. In this example, an 81 nm Ge film can be formed on the SiGe buffer layer. The time necessary to form the Ge film depends on the desired thickness of the Ge film. At box 112, the substrate now having the SiGe—Ge film deposited thereon can be removed from the CVD chamber.

Figure 2:
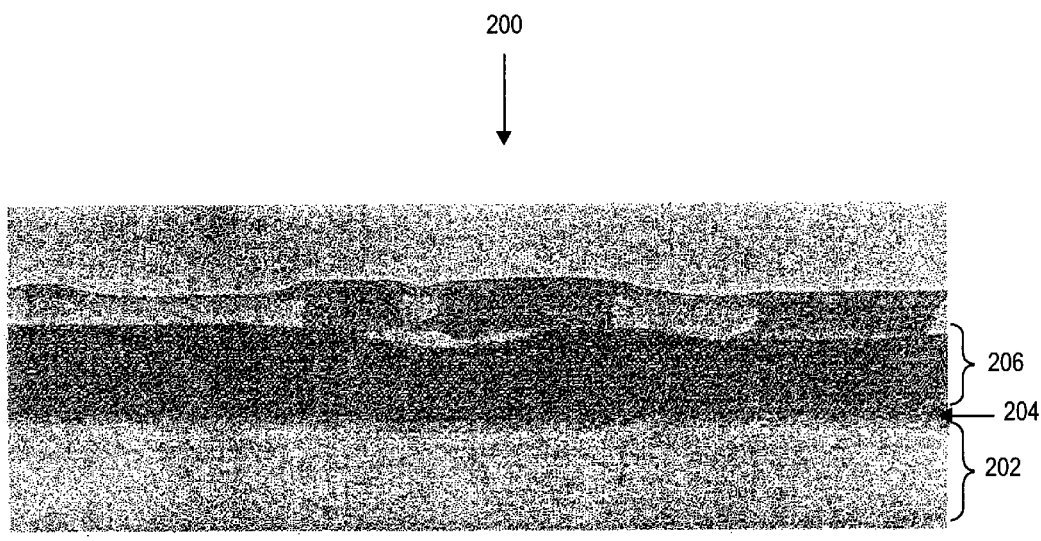
FIG. 2 illustrates an exemplary pure Ge film deposited on an ultra-thin graded SiGe buffer layer in accordance to the present invention.

FIG. 2 illustrates a semiconductor substrate 200 upon which is formed a SiGe—Ge film using the method 100 described in FIG. 1. The SiGe—Ge film has a low defect density, low threading dislocation, and an ultra-thin SiGe buffer layer. FIG. 2 shows a substrate 202, (e.g., a semiconductor substrate or a monocrystalline silicon), an ultra-thin graded buffer SiGe layer 204 and a Ge film 206. In some cases, a very thin layer of Si may have been formed between the substrate 202 and the SiGe buffer layer 204 (e.g., when the silicon source is first introduced into the CVD chamber) before the formation of the SiGe buffer layer 204. In one example, the ultra-thin SiGe buffer layer 204 has a thickness less than 0.5 μm and preferably, a thickness ranging from 17 nm to 30 nm (0.017 μm to 0.030 μm). In another example, the Ge film has a dislocation density less than $10^9$ per $cm^2$. The Ge film may have any desirable thickness depending on the application of the device that is incorporating the film. In one example, the Ge film has a thickness less than 5 μm and preferably, a thickness ranging from 70 nm to 83 nm (0.070 µm to 0.083 µm).

FIG. 3 illustrates another exemplary method 300 to selectively form a graded SiGe—Ge film over a certain regions on a substrate such as a semiconductor wafer. In one example, a mask comprised of a dielectric material such as silicon oxide ($SiO_2$) is used and is deposited on the semiconductor wafer. The graded SiGe—Ge film is formed only over the exposed area of the wafer, the area not covered by the mask. A hydrochlorine source gas (e.g., HCl) is used to help to maintain the selectivity in the deposition of the graded SiGe—Ge film in that the HCl strips off (etches away) any SiGe and/or Ge that may be formed on the $SiO_2$ layer. The HCl also suppresses the nucleation of the graded SiGe—Ge over the $SiO_2$ layer. The resulting graded SiGe—Ge film is less rough and the film's threading dislocation density is dramatically improved.

Continuing with FIG. 3, in one example, at box 302, a deposition chamber (e.g., CVD chamber) is prepared. The desired temperature and pressure for the deposition process is obtained. In one example, the temperature of the chamber is set to be about 625° C. to 700° C. and the pressure is set to be at atmospheric pressure (e.g., 1 atm). A carrier gas is injected into the CVD chamber. The carrier gas flow into the CVD chamber is maintained throughout the deposition process. The carrier is typically an inert gas (e.g., $H_2$, $N_2$, Ar, or He) but can be other suitable carrier gas depending on application. In one example, the carrier gas flow is introduced into the CVD chamber at a flow rate of about 20 L/minute.

At box 304, a substrate (e.g., silicon wafer) is loaded into the CVD chamber. The substrate can include a monocrystalline semiconductor wafer, a semiconductor-on-insulator wafer, or any other substrate used to form semiconductor devices. At box 306, the silicon source gas (e.g., $SiH_4$) is introduced into the CVD chamber. In one example, the silicon source gas is introduced at a rate of about 200 sccm. Also at box 306, an etchant source gas such as hydrochlorine (HCl) is introduced into the CVD chamber. The etchant source gas flow into the CVD chamber is maintained throughout the deposition process. In one example, the etchant source gas is introduced at a rate of about 50 sccm.

At box 308, the graded SiGe buffer layer is selectively formed on the substrate. The substrate includes a dielectric mask formed thereon. While ramping down the temperature, simultaneously decrease the silicon source gas and increase the germanium source gas for a predetermined amount of time. In one example, the predetermined amount of time ranges from 1.5 to 3.5 minutes and preferably, is about 2 minutes. The amount of time depends on the desirable thickness of the SiGe. In another example, for a predetermined amount of time, the temperature is linearly and gradually ramped down, from 625° C. down to 500° C. In yet another example, the silicon source gas is linearly and gradually ramped down, from 200 sccm down to 0 sccm; and, the germanium source gas is linearly and gradually ramped up, from 0 sccm up to 500 sccm. In another example, the silicon source gas is decreased at a rate of 1 sccm to 2 sccm per second, the temperature is decreased at a rate of 1° C. to 1.5° C. per second, and the germanium source gas is increased at a rate of 3.8 sccm to 4.5 sccm per second. In yet another example, the temperature is decreased while simultaneously decreasing the silicon source gas and increasing the germanium source gas at a rate that ensures that the threading dislocation will be confined to the area near the substrate. In this example, the lower temperature and the faster decreasing rate for the temperature is preferred.

Continuing with FIG. 3, at box 310, the Ge film is formed on the graded SiGe buffer layer. To form the Ge film, the temperature is maintained at a predetermined level while the germanium source gas flow is also maintained constant at a predetermined flow rate for a duration necessary to achieve the desired thickness for the Ge film. In one example, the temperature is maintained at 500° C. for the duration of the time necessary to form the Ge film. In another example, the germanium source gas flow is maintained at 500 sccm for that duration. In yet another example, the temperature and the germanium source gas flow is maintained constant for a duration of 5-minute. In this example, an 81 nm Ge film can be formed on the SiGe buffer layer. The time necessary to form the Ge film depends on the desired thickness of the Ge film. At box 312, the substrate now having the SiGe—Ge film deposited only in the exposed area of the wafer can be removed from the CVD chamber. Selectively forming the SiGe buffer layer and the Ge film using the method 300 above shows a dramatic improvement in surface planarity.

Figure 4A:
FIGS. 4A to 4F illustrate an exemplary electronic device comprising a graded germanium film selectively formed on a substrate.
Figure 4B:
Figure 4C:
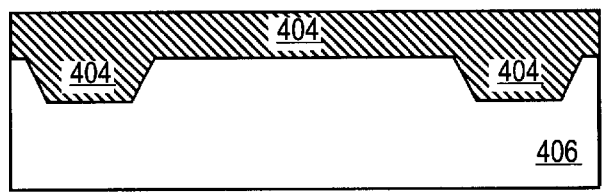
Figure 4D:
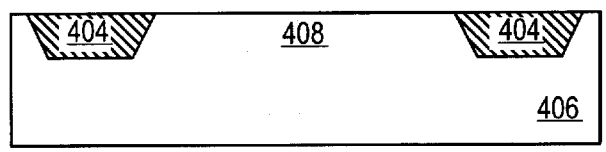

FIGS. 4A to 4D illustrate a cross-section of a structure comprising a substrate with a mask made out of dielectric material (e.g., silicon oxide) which is being used for the selective deposition of the graded SiGe buffer layer and the Ge film discussed in the method 300. The substrate can be a silicon wafer 406 as shown in FIG. 4A. Trenches 402 are then etched into the Si substrate 406 with conventional dry etching methods, as shown in FIG. 4B. The trenches 402 are then filled with silicon oxide ($SiO_2$) with a conventional deposition method, (e.g., plasma enhanced chemical vapor deposition or PE-CVD). A silicon oxide layer 404 is deposited on the entire surface of the wafer, as shown in FIG. 4C. Finally, the silicon oxide layer 404 is polished back with conventional chemical mechanical polishing to expose the silicon substrate 406 between the isolation trenches 402. The reference number 408 illustrates the exposed region in the silicon substrate 406.

Figure 4E:
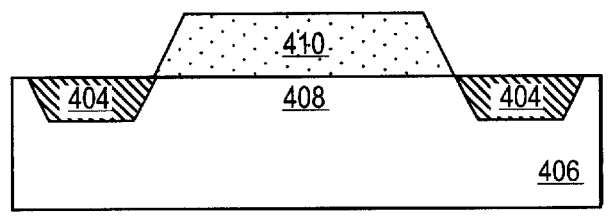

The silicon substrate 406 shown in FIGS. 4A through 4D can then be subjected to selective deposition of the SiGe buffer layer and Ge film discussed in method 300 of FIG. 3. The SiGe—Ge layer 410 is deposited only on the exposed areas 408 of the substrate 406, as shown in FIG. 4E.

Figure 4F:
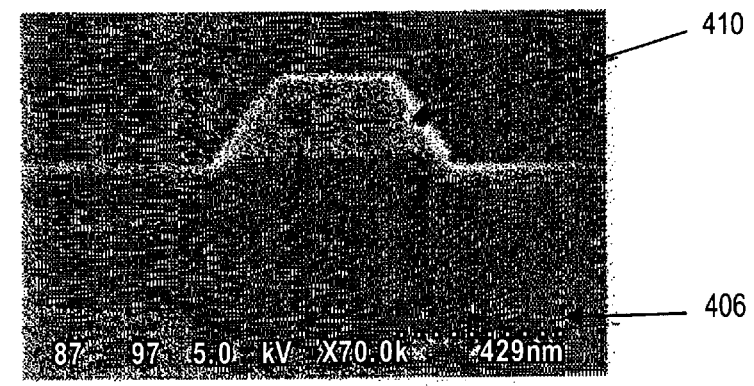

The use of HCl during the deposition of the SiGe buffer layer and the Ge film results in a significant improvement of the planarity of the deposited layer, as shown in FIG. 4F. As shown in this figure, the substrate 406 has a SiGe—Ge film with no visible surface undulations. Elimination of surface undulations is an essential feature oft any deposition scheme. For example, decrease in surface undulation reduces dislocation pileups and the overall defect density in the Ge film. Furthermore, a conventional chemical mechanical polishing step typically used to reduce the surface undulation is not necessary for the method 300 discussed in FIG. 3.

Figure 5:
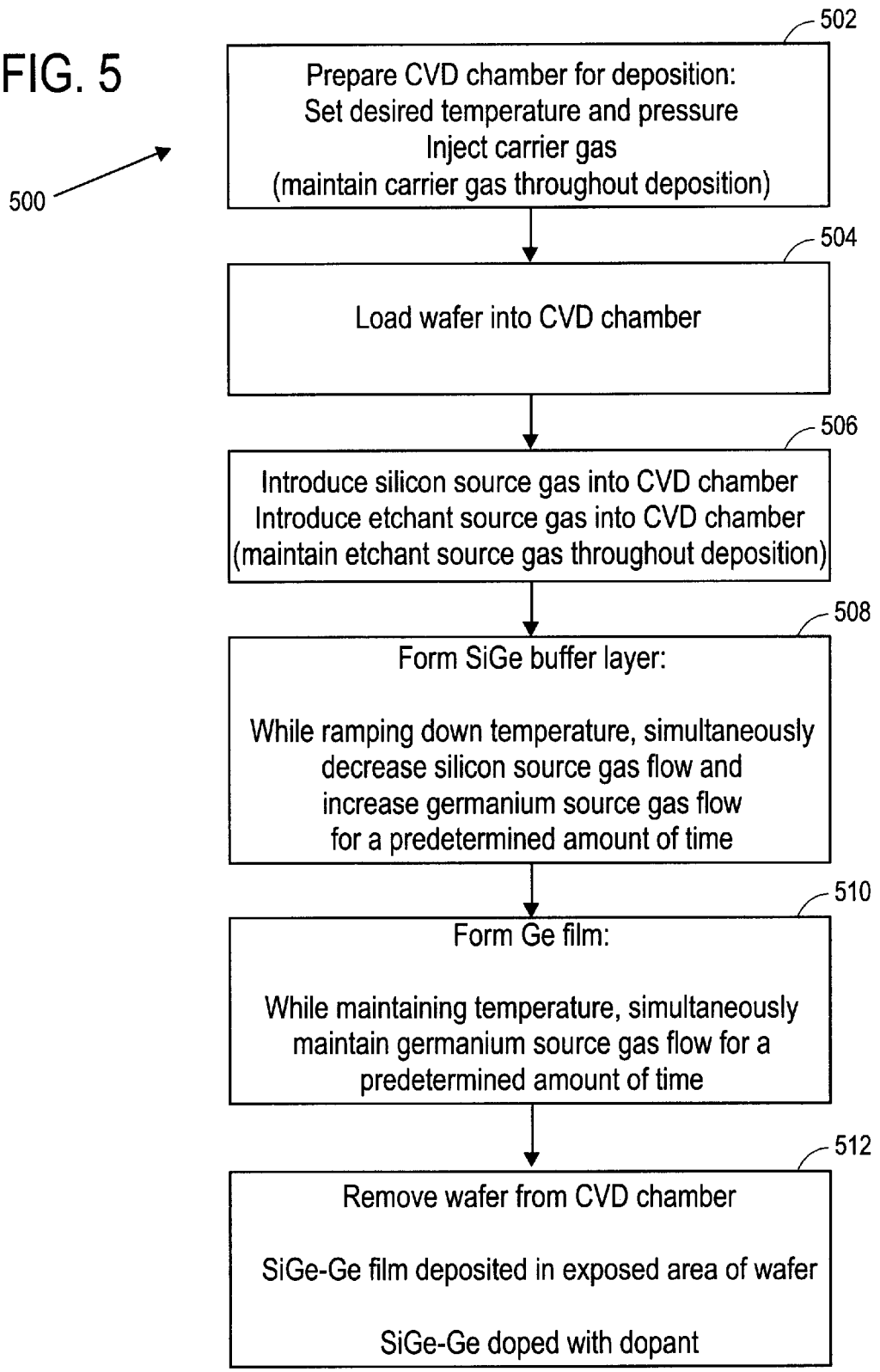
FIG. 5 illustrates an exemplary method of selectively forming a graded germanium film which comprises an ultra-thin graded SiGe buffer wherein the a graded germanium film is doped with a dopant, for example, phosphorous.

FIG. 5 illustrates another exemplary method 500 used to selectively form an in-situ doped Ge layer, which is formed on a SiGe buffer layer which is formed on a substrate. In one example, the Ge layer is doped with boron. In another example, the Ge layer is doped with arsenic or phosphorus.

At box 502, a deposition chamber (e.g., CVD chamber) is prepared. The desired temperature and pressure for the deposition process is obtained. In one example, the temperature of the chamber is set to be about 625° C. to 700° C. and the pressure is set to be at atmospheric pressure (e.g., 1 atm). A carrier gas is injected into the CVD chamber. The carrier gas flow into the CVD chamber is maintained throughout the deposition process. The carrier is typically an inert gas (e.g., $H_2$, $N_2$, Ar, or He) but can be other suitable carrier gas depending on application. In one example, the carrier gas flow is introduced into the CVD chamber at a flow rate of about 20 L/minute.

At box 504, a substrate (e.g., silicon wafer) is loaded into the CVD chamber. The substrate can include a monocrystalline semiconductor wafer, a semiconductor-on-insulator wafer, or any other substrate used to form semiconductor devices. At box 506, the silicon source gas (e.g., $SiH_4$) is introduced into the CVD chamber. In one example, the silicon source gas is introduced at a rate of about 200 sccm. Also at box 506, an etchant source gas such as hydrochlorine (HCl) is introduced into the CVD chamber. The etchant source gas flow into the CVD chamber is maintained throughout the deposition process. In one example, the etchant source gas is introduced at a rate of about 50 sccm.

At box 508, the graded SiGe buffer layer is selectively formed on the substrate. The substrate includes a dielectric mask formed thereon. While ramping down the temperature, simultaneously decrease the silicon source gas and increase the germanium source gas for a predetermined amount of time. In one example, the predetermined amount of time ranges from 1.5 to 3.5 minutes and preferably, is about 2 minutes. The amount of time depends on the desirable thickness of the SiGe. In another example, for a predetermined amount of time, the temperature is linearly and gradually ramped down, from 625° C. down to 500° C. In yet another example, the silicon source gas is linearly and gradually ramped down, from 200 sccm down to 0 sccm; and, the germanium source gas is linearly and gradually ramped up, from 0 sccm up to 500 sccm. In another example, the silicon source gas is decreased at a rate of 1 sccm to 2 sccm per second the temperature is decreased at a rate of 1° C. to 1.5° C. per second, and the germanium source gas is increased at a rate of 3.8 sccm to 4.5 sccm per second. In yet another example, the temperature is decreased while simultaneously decreasing the silicon source gas and increasing the germanium source gas at a rate that ensures that the threading dislocation will be confined to the area near the substrate. In this example, the lower temperature and the faster decreasing rate for the temperature is preferred.

Continuing with FIG. 5, at box 510, the in-situ doped Ge film is formed on the graded SiGe buffer layer. To form the in-situ doped Ge film, while the temperature is maintained at a predetermined level, the flow of the germanium source gas and a dopant source gas are maintained constant for a duration necessary to achieve the desired thickness for the in-situ doped Ge film. The dopant source gas can be a boron dopant, an arsenic dopant, a phosphorous dopant, or other suitable doping agent. In one example, the temperature is maintained at 500° C. for the duration of the time necessary to form the in-situ doped Ge film. In another example, the dopant source gas is phosphine ($PH_3$), which can be introduced into the chamber and maintained at a rate of about 20 sccm. In another example, the germanium source gas flow is maintained at 500 sccm for that duration. The temperature, the flow of the germanium source gas and the dopant source gas can be maintained constant for a duration of 5-minutes. In this example, an 81 nm in-situ doped Ge film can be formed on the SiGe buffer layer. The time necessary to form the Ge film depends on the desired thickness of the Ge film. At box 512, the substrate can be removed from the CVD chamber. The substrate now has the in-situ doped Ge deposited on the SiGe buffer layer only in the exposed area of the wafer.

The use of the methods 300 of FIG. 3 and 500 of FIG. 5 for selectively forming the graded SiGe—Ge film on substrate present unique issues when attempting to deposit Ge layers that are both selective and in-situ doped. As discussed, selective deposition of the Ge film and the SiGe buffer layers is typically achieved by adding an etchant agent such as HCl to the gas stream. Doping can be performed either in-situ, by adding appropriate gasses to the gas stream, e.g., borane ($B_2H_6$), phosphine ($PH_3$), or arsine ($AsH_3$), or ex-situ through ion implantation. Achieving the highest possible level of doping while tightly controlling the positioning of the dopant species is critical for applications such as heterojunction bipolar transistors (HBT), or transistors that have a raised source and drain, in order to achieve maximum transistor performance. This task can be achieved only with in-situ doping of the layers as they are deposited.

However, the presence of an etchant agent in the gas stream, which is required to maintain selective deposition, decreases the incorporation of the dopants in the deposited films, and therefore degrades device performance. It is thus difficult to achieve good dopant incorporation in the presence of an etchant agent. In fact, in extreme cases such as boron doping of Ge with $B_2H_6$, it is not possible to achieve dopant incorporation higher than $10^{16}/cm^3$ in the presence of HCl in the gas stream. Typically only the Ge layer is doped, though the buffer can also be doped if desired. In that case the dopant needs to be turned on at box 506 in FIG. 5.

Figure 6:
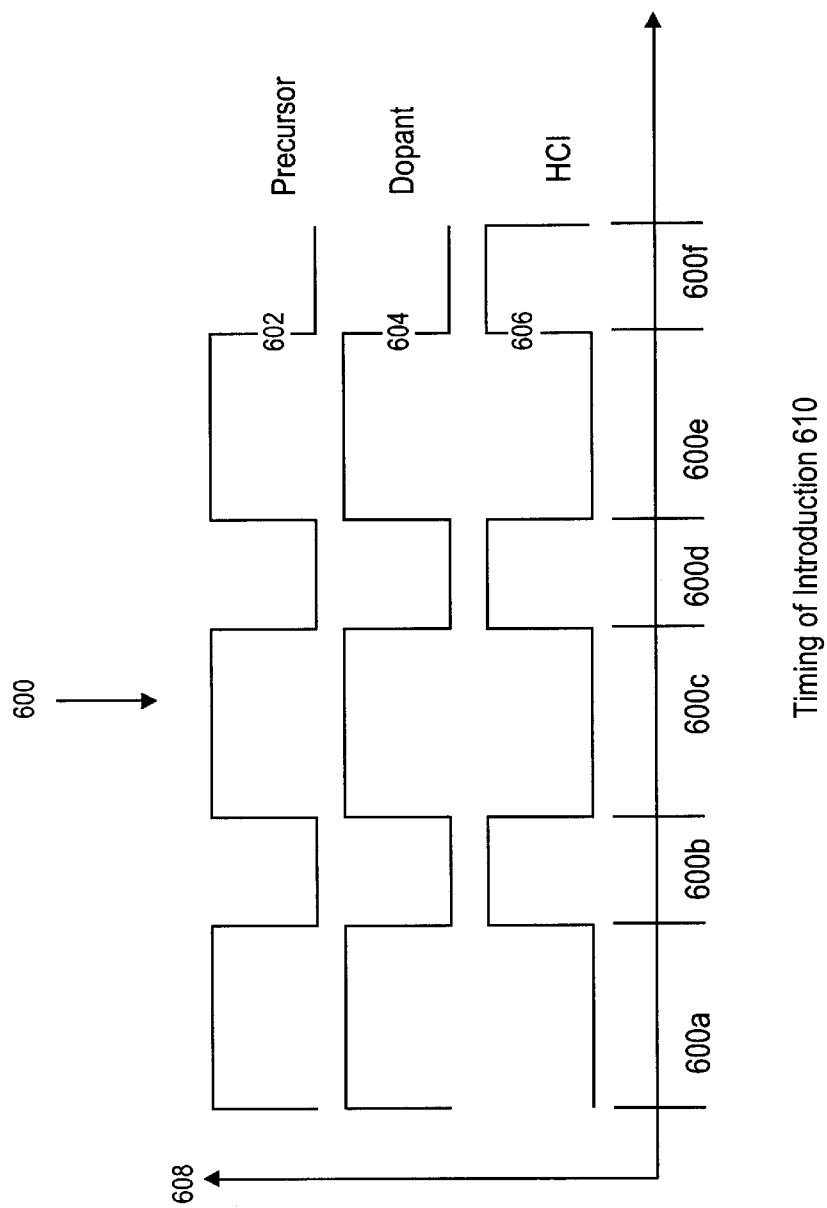
FIG. 6 illustrates an exemplary sequencing of dopant, precursor, and HCl flows to achieve heavy doping in selectively deposited Ge layers.

In another exemplary embodiment, the difficulty of growing in situ-doped, selective, and graded SiGe—Ge film is resolved by properly timing the flow of the germanium source gas, the etchant source gas, and the dopant source gas. FIG. 6 illustrates a timing scheme of introducing the germanium source gas, the dopant source gas, and the etchant source gas to achieve heavy in-situ doping of the graded SiGe—Ge film selectively formed over a substrate. In one example, the portion of the method that is used to deposit the Ge film consists of alternating "Ge deposit" and "Ge etch" steps.

Graph 600 of FIG. 6 plots timeline 610 versus a flow rate 608 which shows the time of introduction and the duration for the flow of the germanium source gas, the etchant source gas, and the dopant source gas. The etchant source gas for graph 600 is HCl. During the "Ge deposit" step, the germanium source gas and the dopant source gas are turned on simultaneously while the HCl source gas is turned off. The graph 600 illustrates that during the "Ge deposit" step, the flows for the germanium source gas (precursor) 602 and the dopant source gas 604 are turned on and the flow for the HCl source gas 606 is turned off (see for example, sections 600a, 600c, and 600e of timeline 610). Since there is no HCl present, the deposited Ge layer is doped, but is not selective. The deposition of the Ge is on the entire surface of the substrate, including the dielectric mask. In this example, the deposition rate of the Ge film on the dielectric layer is lower than the deposition of the Ge film on the SiGe buffer layer. Alternatively, the layer deposited on the dielectric is thinner than on the SiGe buffer layer.

During the "Ge etch" step, the flow for the germanium source gas 602 and dopant source gas 604 are turned off, and the flow for the hydrochloride source gas 606 is turned on. The graph 600 further illustrates that during the "Ge etch" step, the flow for the germanium source gas 602 and the dopant source gas 604 are turned off and the flow for the HCl source gas 606 is turned on (see for example, sections 600b, 600d, and 600f of timeline 610). The germanium film is etched from the surface of the substrate during the "Ge-etch" step. Since the Ge film on the dielectric layer is thinner than the Ge film on the graded SiGe buffer layer, the Ge that was deposited on the dielectric layer is etched away or removed from the dielectric layer. Complete selectivity and high dopant concentration can be maintained through an appropriate choice for the duration of the "Ge deposit" and the "Ge etch" steps.

FIG. 7 illustrates an exemplary method 700 for selectively forming a heavily-doped and graded SiGe—Ge upon a wafer. In the method 700, the doping is in-situ. The method 700 selectively forms a heavily doped Ge layer which is formed on a graded SiGe buffer layer which is formed on a substrate.

At box 702, a deposition chamber (e.g., CVD chamber) is prepared. The desired temperature and pressure for the deposition process is obtained. In one example, the temperature of the chamber is set to be about 625° C. to 700° C. and the pressure is set to be at atmospheric pressure (e.g., 1 atm). A carrier gas is injected into the CVD chamber. The carrier gas flow into the CVD chamber is maintained throughout the deposition process. The carrier is typically an inert gas (e.g., $H_2$, $N_2$, Ar, or He) but can be other suitable carrier gas depending on application. In one example, the carrier gas flow is introduced into the CVD chamber at a flow rate of about 20 L/minute.

At box 704, a substrate (e.g., silicon wafer) is loaded into the CVD chamber. The substrate can include a monocrystalline semiconductor wafer, a semiconductor-on-insulator wafer, or any other substrate used to form semiconductor devices. At box 706, the silicon source gas (e.g., $SiH_4$) is introduced into the CVD chamber. In one example, the silicon source gas is introduced at a rate of about 200 sccm.

At box 708, the graded SiGe buffer layer is selectively formed on the substrate. The substrate includes a dielectric mask formed thereon. While ramping down the temperature, simultaneously decrease the silicon source gas and increase the germanium source gas for a predetermined amount of time. In one example, the predetermined amount of time ranges from 1.5 to 3.5 minutes and preferably, is about 2 minutes. The amount of time depends on the desirable thickness of the SiGe. In another example, for a predetermined amount of time, the temperature is linearly and gradually ramped down, from 625° C. down to 500° C. In yet another example, the silicon source gas is linearly and gradually ramped down, from 200 sccm down to 0 sccm; and, the germanium source gas is linearly and gradually ramped up, from 0 sccm up to 500 sccm. In another example, the silicon source gas is decreased at a rate of 1 sccm to 2 sccm per second, the temperature is decreased at a rate of 1° C. to 1.5° C. per second, and the germanium source gas is increased at a rate of 3.8 sccm to 4.5 sccm per second. In yet another example, the temperature is decreased while simultaneously decreasing the silicon source gas and increasing the germanium source gas at a rate that ensures that the threading dislocation will be confined to the area near the substrate. In this example, the lower temperature and the faster decreasing rate for the temperature is preferred.

At box 710, the heavily in-situ doped Ge film is formed on the SiGe buffer layer. To form the heavily doped Ge film, the flow of the germanium source gas, a dopant source gas, and an etchant source gas are properly timed as discussed in FIG. 6. An etchant source gas is introduced into the chamber in a manner such that the flows of the germanium source gas and the dopant source gas are alternating with the flow of the etchant source gas for a predetermined amount of time. The alternating of the flow of the germanium source gas and the dopant source gas with the flow of the etchant source gas for a predetermined amount of time can be repeated as necessary depending on the thickness of the desired Ge film. In one example, the sequence of selectively forming the heavily dope Ge film is as followed. (1) The deposition temperature is maintained at about 500° C. throughout the sequence. (2) For about the first 10 seconds of the deposition process, the germanium source gas flow is maintained at 500 sccm and the dopant source gas (e.g., $B_2H_6$) is maintained at a flow rate of about 100 sccm. (3) For about the next 5 seconds of the deposition process, the germanium source gas and the boron source gas is turned off, and the etchant source gas (e.g., HCl) is introduced and maintained at a flow rate of about 50 sccm. (4) The steps (2) to (3) are repeated for several times as needed to selectively form the heavily dope Ge film of a desirable thickness. For a heavily dope Ge film of about 80 nm, the steps (2) to (3) are repeated for 30 times. It will be appreciated that any of the parameters above can be modified without exceeding the scope of the method 700.

At box 712, the substrate can be removed from the CVD chamber. The Ge film and the graded SiGe buffer layer are both selectively formed in the exposed area of the two wafers. Furthermore, the Ge film is heavily doped with, for example, boron. In one example, the Ge film that is selectively formed using the method 700 has a dopant level in excess of $1 \times 10^{20}$ per $cm^3$.

It will be appreciated that the method 700 can be applied to other dopants, for example, phosphorous and arsenic.

The graded SiGe—Ge film made in accordance with some of the exemplary embodiments discussed above can be integrated into making electronic devices such as transistors, capacitors, resistors or optical detectors. For purpose of illustration, the following discussion describes briefly exemplary integrations of the graded SiGe—Ge film into a transistor and a detector.

Figure 8A:
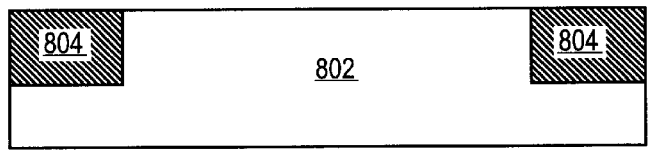
FIGS. 8A to 8D illustrate an exemplary semiconductor device (e.g., a transistor) that integrates a selectively deposited germanium film made in accordance to the present invention.

FIGS. 8A to 8D illustrate a process of making a Ge body transistor in accordance with the present invention. FIG. 8A illustrates that the silicon wafer substrate 802 may include shallow trench isolations 804 formed using conventional methods to insulate one device from another. For example, the shallow trench isolations 804 are formed by convention etching method to first etch regions for the shallow trench isolation 804 and these regions are filled with an insulator, typically $SiO_2$. In one example, a conventional chemical mechanical polishing method may be used to polish the substrate 802 to ensure sufficient planarity.

Figure 8B:
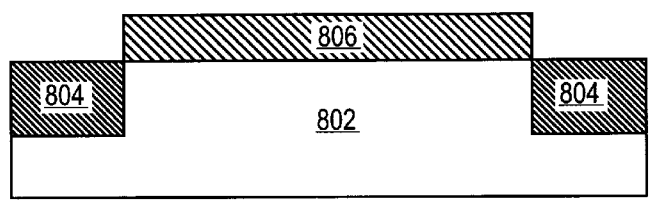

FIG. 8B illustrates that a germanium film is formed on a graded SiGe buffer layer which is formed on the surface of the semiconductor wafer substrate 802. The germanium film and the graded SiGe buffer layer together are referred to as a graded SiGe—Ge film 806. The graded SiGe—Ge film 806 is selectively formed on the semiconductor wafer substrate 802 using the exemplary methods discussed above, for example, the method 500 or the method 700 described in FIG. 5 and FIG. 7, respectively. The graded SiGe—Ge film 806 is formed only on the exposed regions of the silicon wafer substrate 802. The selectively deposited and graded SiGe—Ge film 806 will form the body of the device 800, for example, a Ge channel for a transistor, as opposed to the traditional Si channel in a transistor. In one example, the graded SiGe—Ge film 806 is moderately doped (e.g., $1 \times 10^{16}$ per $cm^3$ to $1 \times 10^{18}$ per $cm^3$). In one example, the doping concentration is chosen to properly target transistor threshold voltage. The graded SiGe—Ge film 806 can be a channel for the device 800.

Figure 8C:
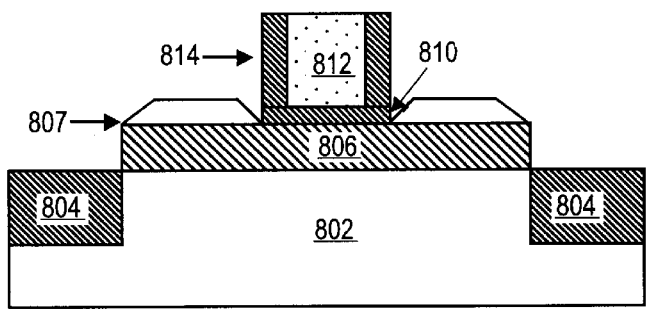

FIG. 8C illustrates that a gate dielectric 810, a gate electrode 812, and spacers 814 can be formed on the top surface of the graded SiGe—Ge film 806 using conventional methods (e.g., conventional film deposition and patterning).

In one example, the gate dielectric 810 can be deposited by a blanket deposition of a high-k oxide film. The deposition of the gate dielectric 810 is necessary since germanium does not form a stable oxide. In one example, the gate dielectric 810 is made out of a high-k dielectric material such as zirconium oxide ($ZrO_2$). The gate electrode 812 can also be formed by a blanket deposition. The gate electrode 812 can be made out of a metal containing material, such as titanium nitride or tungsten, for a metal gate. The gate electrode 812 can be appropriately doped poly-Silicon such as for a conventional gate. In one example, after the gate dielectric 810 and the gate electrode 812 are blanket deposited over the graded SiGe—Ge film 806, they are patterned to define the dimension of the gate dielectric 810 and the gate electrode 812. The gate dielectric 810 and the gate electrode 812 are patterned in a single process. The spacers 814, typically comprise of a combination of $SiO_2$ and $Si_3N_4$ are also formed, first, by blanket deposition. And then, the spacers 814 are defined using conventional spacer etching method.

FIG. 8C illustrates that another Ge film 807 can be formed on the graded SiGe—Ge film 806 using the methods described above (e.g., method 500 or the method 700 described in FIG. 5 and FIG. 7, respectively) for selectively forming the Ge film 807. The Ge film 807 does not need to be formed with the graded SiGe buffer layer. A mask may be used to prevent Ge film forming on the gate electrode 812 that comprises doped poly-Silicon such as for a conventional gate. The Ge film 807 can be heavily doped using the method 700 discussed in FIG. 7. In one example, the Ge film 807 has a dopant concentration of $1 \times 10^{20}$ per $cm^3$. The heavily doped Ge 807 forms the source and drain regions of the transistor.

Figure 8D:
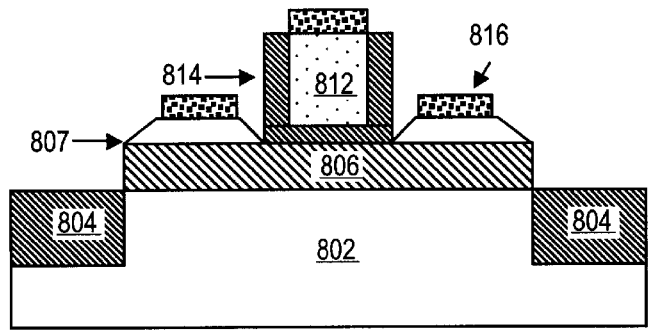

FIG. 8D illustrates that a nickel-germanium (NiGe) layer 816 may be formed on the Ge film 807 over the regions that are not covered with the gate dielectric 810 and the spacers 814. In one example, the NiGe layer is formed by a low-temperature annealing method using an annealing temperature of about 400° C. to 600° C. Depositing a metal (e.g., nickel) that reacts with the material in the transistor body can substantially lower the resistivity of the source and drain contacts. Conventional methods are used to anneal the substrate 802. The annealing temperature for the transistor 800 comprising the Ge film 807 is kept low, 400° C. to 600° C., to prevent the refractory metal from agglomerating, which tends to increase the resistivity of the source and drains 808 and degrade the performance of the transistor 800. The refractory metal used to anneal the transistor 800 comprising the Ge film 807 is preferably nickel (Ni). Alternatively, another metal with low resistivity can be used.

Those skilled in the art will recognize that the features mentioned in FIGS. 8A to 8D, and other features, may be used or may be left out, depending upon the particular function of the device. For example, after the formation of the NiGe layer, the transistor 800 is subjected to conventional process steps for forming interlayer dielectrics, contacts, and metal interconnects, etc.

Figure 9A:
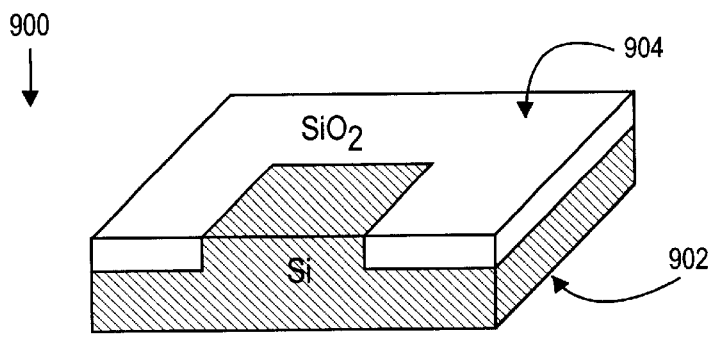
FIGS. 9A to 9D illustrate an exemplary semiconductor device (e.g., a detector) that integrates a selectively deposited germanium film made in accordance to the present invention.

FIGS. 9A to 9D illustrate an electronic device 900 made in accordance with the present invention. In one example, the electronic device 900 is an integrated detector comprising germanium that may provide electrical output driven by an optical input to integrated circuits in a substrate. FIG. 9A illustrates that the semiconductor wafer substrate 902 may include shallow trench isolations 904 formed using conventional methods to insulate one device from another. The shallow trench isolations 904 are formed by conventional etching method to first etch regions for the shallow trench isolation 904 and these regions are filled with an insulator, typically $SiO_2$. In one example, a conventional chemical mechanical polishing method may be used to polish the substrate 902 to ensure sufficient planarity.

Figure 9B:
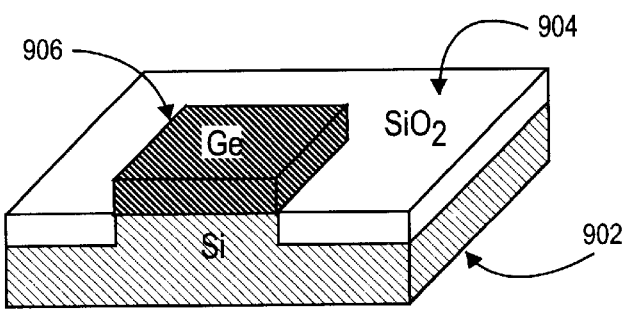

FIG. 9B illustrates that a germanium film is formed on a graded SiGe buffer layer which is formed on the surface of the semiconductor wafer substrate 902. The germanium film and the graded SiGe buffer layer together are referred to as a graded SiGe—Ge film 906. The graded SiGe—Ge film 906 is selectively formed on the semiconductor wafer substrate 902 using the exemplary methods discussed above, for example, the method 500. The graded SiGe—Ge film 906 is formed only on the exposed regions of the substrate 902 as discussed above. The selectively deposited and graded SiGe—Ge film 906 will form the body of the detector 900. In one example, the SiGe—Ge film is not doped as in the case of the transistor 800 to ensure maximum performance for the detector.

Figure 9C:
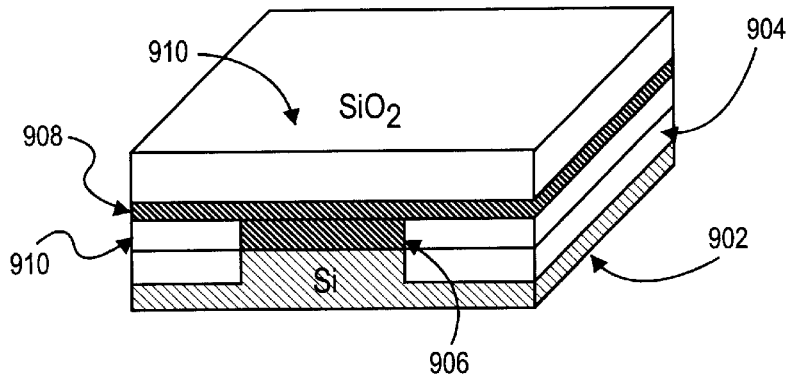

FIG. 9C illustrates that a waveguide 908 is formed on the graded SiGe—Ge film 906 using conventional methods. The waveguide 908 is encapsulated by oxide layers 910 which are dielectric layers. It is common for the integrated structure to have the waveguide 908 be made out of a relatively high-refractive index material (e.g., $Si_3N_4$ which has a refractive index n=2.05). The waveguide 908 is typically encapsulated in a material with lower refractive index (e.g., $SiO_2$ which has a refractive index n=1.46). When light is introduced in the waveguide 908 having the high refractive index material, the light will be confined there. The waveguide 908 then "guides" the light from the source (typically an external laser) to the detector (in this case the selectively deposited and graded SiGe—Ge film 906).

Figure 9D:
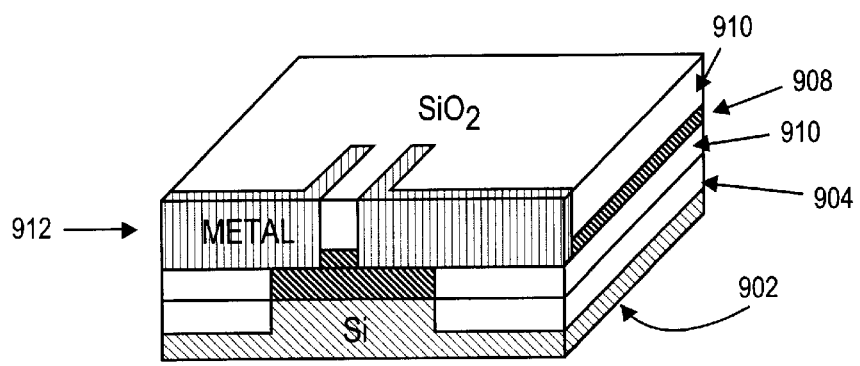

FIG. 9D illustrates that detector electrodes 912 are formed in the top oxide layer 910. In order for the graded SiGe—Ge film 906 to function as a detector, a bias must be applied across it. Any light shining on the detector 900 then generates electron-hole pairs. These pairs are swept by the bias field, causing current to flow through the SiGe—Ge film 906. There is an electrical response to a light impulse. The detector electrodes 912 are needed to provide the required bias. In one example, a conductive material, such as metal, is deposited and then patterned using conventional methods. In this example, the detector electrodes 912 are deposited by a damascene process, well practiced in the field. More specifically, a trench is defined with standard litho techniques in the top oxide layer 910; then, a metal is deposited everywhere (so that the trench is completely filled); then, the excess metal on the top surface of the top oxide layer 910 is polished off.

The methods made in accordance with the present invention, such as those exemplary embodiments discussed above, enable the making of ultra-thin graded SiGe buffer layers upon which low defect Ge films can be grown. The germanium film made according to the present invention can be easily integrated into semiconductor devices. The methods also enable selective deposition of the low defect Ge film that is heavily doped in situ. The methods thus enable the making of semiconductor devices that take advantage of the desirable material properties of Ge and at the same time integrate with Si modern manufacturing techniques.

We claim:

1. A method of forming a semiconductor device comprising:

placing a semiconductor substrate in a deposition chamber; and simultaneously decreasing the flow rate of a silicon source gas, increasing the flow rate of a germanium source gas and decreasing a deposition temperature over a predetermined amount of time to generate on said semiconductor substrate a graded germanium film that comprises an ultra-thin silicon-germanium buffer layer and a germanium layer wherein said silicon source gas is decreased and said germanium source gas is increased at different rates.

2. A method as in claim 1 wherein the flow rate of said silicon source gas is decreased from a first rate to second rate;
the flow rate of said germanium source gas is increased from a third rate to a fourth rate; and
the deposition temperature is decreased from a first temperature to a second temperature.

3. A method as in claim 2 further comprising maintaining said deposition temperature at said second temperature for another predetermined amount of time to form said germanium layer.

4. A method as in claim 3 further comprising injecting a dopant source gas into said deposition chamber to dope said germanium layer.

5. A method as in claim 1 wherein the flow rate of said silicon source gas is decreased at a rate between 1 sccm and 2 sccm per second;
the flow rate of said germanium source gas is increased at a rate between 3.8 sccm and 4.5 sccm per second; and
said deposition temperature is decreased at a rate between 1° C. and 1.5° C. per second.

6. A method as in claim 1 further comprising:
depositing a mask over said semiconductor substrate, said mask defining areas for growing said graded germanium film on said semiconductor substrate; and
injecting an etchant source gas into said deposition chamber.

7. A method as in claim 1 wherein germanium source gas is increased at a faster rate than a rate said silicon source gas is decreased.

8. A method of forming a semiconductor device comprising:
placing a substrate in a deposition chamber operated at a first deposition temperature;
introducing a silicon source gas at a first flow rate into said deposition chamber;
for a first predetermined amount of time, simultaneously decreasing said first flow rate to a second flow rate and decreasing said first deposition temperature to a second deposition temperature while increasing the flow rate for a germanium source gas into said deposition chamber until said germanium source gas reaches a third flow rated, wherein said silicon source gas is decreased and said germanium source gas is increased at different rates;
introducing a dopant source gas into said deposition chamber when said germanium source gas is introduced into said deposition chamber; and
for a second predetermined amount of time, introducing an etchant source gas into said deposition chamber wherein when said germanium source gas and said dopant source gas are present in said deposition chamber, said etchant source gas flow is shut off and wherein when said etchant source gas is present in said deposition chamber, said germanium source gas and said dopant source gas flows are shut off.

9. A method as in claim 8 further comprising:
simultaneously maintaining said flows of said dopant source gas and said germanium source gas while shutting off said etchant source gas for a third predetermined amount of time;
simultaneously shutting off said flows of said dopant source gas and said germanium source gas while maintaining said flow of said etchant source gas for a fourth predetermined amount of time, wherein said fourth predetermined amount of time is less than said third predetermined amount of time; and
repeating said simultaneously maintaining said flows of said dopant source gas and said germanium source gas while shutting off said etchant source gas and said simultaneously shutting off said flows of said dopant source gas and said germanium source gas while maintaining said flow of etchant source gas for as many times as necessary to achieve a desired thickness for said graded germanium film.

10. A method as in claim 9 wherein said third predetermined amount of time is about 10 seconds and said fourth predetermined amount of time is about 5 seconds.

11. A method of forming a graded germanium film having a silicon-germanium buffer layer and a germanium layer on a semiconductor substrate:
obtaining a deposition temperature and a deposition pressure in a deposition chamber used for said forming of said graded germanium film;
placing said semiconductor substrate in said deposition chamber;
introducing a silicon source gas flow into said deposition chamber;
while ramping down said deposition temperature, simultaneously decreasing said silicon source gas flow and increasing a germanium source gas flow for a first predetermined amount of time, wherein said silicon source gas is decreased and said germanium source gas is increased at different rates; and
maintaining said germanium source gas flow for a second predetermined amount of time.

12. A method as in claim 11 wherein the flow rate of said silicon source gas is decreased from a first flow rate to a second flow rate;
the flow rate of said germanium source gas is increased from a third flow rate to a fourth flow rate; and
decreasing said deposition temperature from a first temperature down to a second temperature.

13. A method as in claim 11 further comprising injecting a dopant source gas into said deposition chamber during said second predetermined amount of time to dope said germanium layer.

14. A method as in claim 11 wherein the flow rate of said silicon source gas is decreased at a rate between 1 sccm and 2 sccm per second;
the flow rate of said germanium source gas is increased at a rate between 3.8 sccm and 4.5 sccm per second; and
said deposition temperature is decreased at a rate between 1° C. and 1.5° C. per second.

15. A method of selectively forming a graded germanium film having a silicon-germanium buffer layer and a germanium layer on a semiconductor substrate comprising:
obtaining a deposition temperature and a deposition pressure in a deposition chamber used for said forming of said graded germanium film;
placing said semiconductor substrate in said deposition chamber, said semiconductor substrate comprising a dielectric mask;
introducing a silicon source gas flow into said deposition chamber;

while ramping down said deposition temperature, simultaneously decreasing said silicon source gas flow and increasing a germanium source gas flow for a first predetermined amount of time, wherein said silicon source gas is decreased and said germanium source gas is increased at different rates; and maintaining said germanium source gas flow for a second predetermined amount of time.

16. A method as in claim 15 further comprising:

introducing an etchant source gas into said deposition chamber.

17. A method as in claim 16 further comprising:

for a third predetermined amount of time, introducing a dopant source gas into said deposition chamber wherein when said germanium source gas and said dopant source gas are present in said deposition chamber, said etchant source gas flow is shut off and wherein when said etchant source gas is present in said deposition chamber, said germanium source gas and said dopant source gas flows are shut off.

18. A method as in claim 17 wherein said introducing dopant source gas into said deposition chamber while alternating flows of said germanium source gas and said dopant source gas with a flow of said etchant source gas is repeated as many times as necessary to achieve a desired thickness for said graded germanium film.

* * * * *